United States Patent [19]
Yamazaki

[11] Patent Number: 6,037,635
[45] Date of Patent: Mar. 14, 2000

[54] SEMICONDUCTOR DEVICE WITH TRANSISTORS FORMED ON DIFFERENT LAYERS

[75] Inventor: Shunpei Yamazaki, Tokyo, Japan

[73] Assignee: Semiconductor Energy Laboratory Co., Ltd., Kanagawa-ken, Japan

[21] Appl. No.: 09/013,578

[22] Filed: Jan. 27, 1998

[30] Foreign Application Priority Data

Jan. 28, 1997 [JP] Japan .................................. 9-029553

[51] Int. Cl.[7] .......................... H01L 27/01; H01L 27/12; H01L 31/0392
[52] U.S. Cl. ........................... 257/353; 257/66; 257/351; 257/352
[58] Field of Search ................................ 257/57, 66, 347, 257/351, 352, 353

[56] References Cited

U.S. PATENT DOCUMENTS

| | | | |
|---|---|---|---|
| 5,041,884 | 8/1991 | Kumamoto et al. | |
| 5,541,432 | 7/1996 | Tsuji | 257/350 |
| 5,565,697 | 10/1996 | Asakawa et al. | 257/347 |
| 5,585,647 | 12/1996 | Nakajima et al. | 257/72 |
| 5,614,733 | 3/1997 | Zhang et al. | 257/66 |
| 5,684,320 | 11/1997 | Kawashima | 257/351 |
| 5,731,613 | 3/1998 | Yamazaki et al. | 257/350 |
| 5,899,547 | 5/1999 | Yamazaki et al. | 349/43 |

*Primary Examiner*—Ngân V. Ngô
*Attorney, Agent, or Firm*—Fish & Richardson P.C.

[57] ABSTRACT

In a thin film transistor circuit, active layers 113, 109 and 110 are formed using silicon films which are obtained by crystal growth in parallel to a substrate from a region into which nickel elements have been selectively introduced. In this situation, the active layer 113 is formed above a lower nickel introduced region 11. Then, the lower active layer 109 is formed below the upper nickel introduced region 10. With this structure, the integration density of the device can be enhanced.

19 Claims, 6 Drawing Sheets

SEMICONDUCTOR DEVICE WITH TRANSISTORS FORMED ON DIFFERENT LAYERS

BACKGROUND OF THE INVENTION

1. Field of the Invention

The present invention relates to a semiconductor device in which thin film transistors are integrated.

2. Description of the Related Art

Up to now, there has been known a TFT (thin film transistor) using a glass substrate or a quartz substrate.

The thin film transistor has been mainly developed for use in an active matrix type liquid crystal display device. There has been estimated that an attempt will be made to form a variety of integrated circuits by the thin film transistor.

SUMMARY OF THE INVENTION

The present invention has been made in view of the above circumstances, and therefore an object of the present invention is to provide a nobel structure in which thin film transistors are integrated.

In order to solve the above problem, according to the present invention, there is provided a semiconductor device which comprises: at least two thin film transistors formed on different layers; wherein each of said at least two thin film transistors has an active layer which is formed of a crystalline silicon film that is subjected to crystal growth toward an orientation in parallel to the layer from a predetermined region into which metal elements that promote crystallization of silicon have been introduced; and wherein said region into which the metal elements have been introduced exists above or below at least one of the active layers that constitute said thin film transistors.

According to another aspect of the present invention, there is provided a semiconductor device which comprises a plurality of thin film transistors formed on different layers, wherein each of said thin film transistors has a gate insulating film and a gate electrode which are formed in the same layer.

Figure 3A:
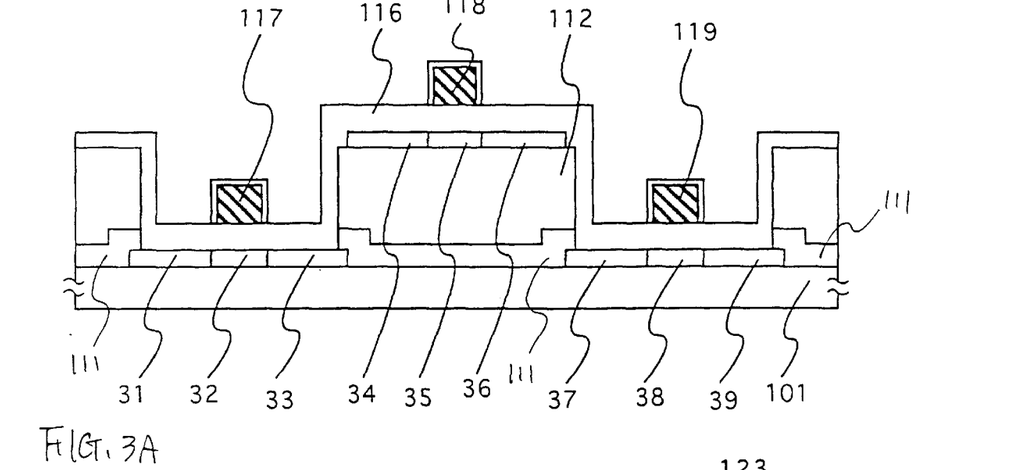
FIGS. 3A to 3C are diagrams showing a process of manufacturing a thin film transistor of the first embodiment.
Figure 3B:
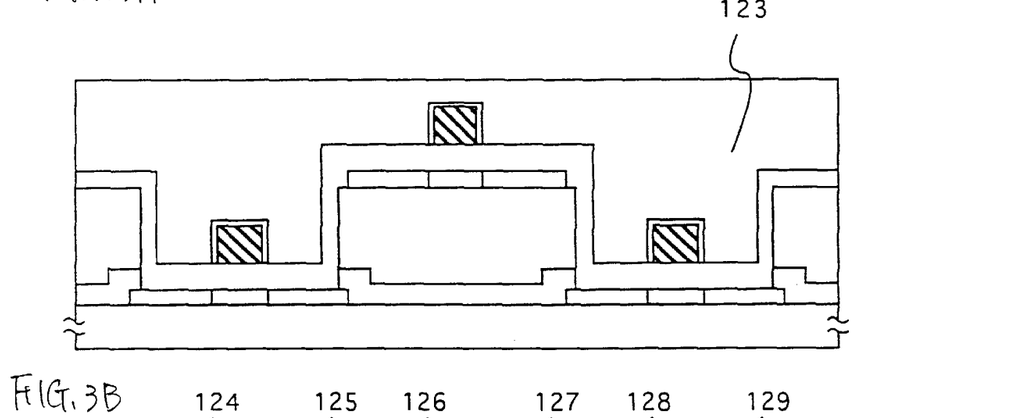
Figure 3C:
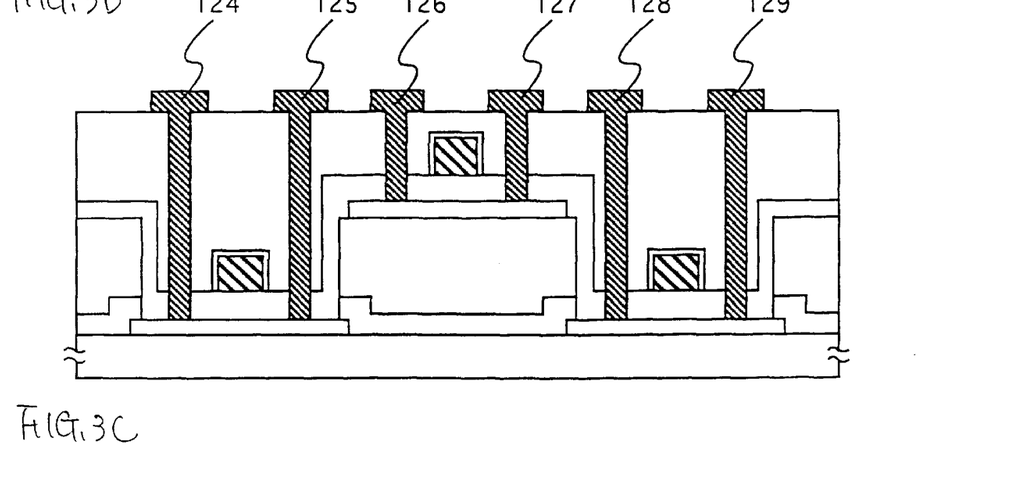

A specific example of the above structure is shown in FIGS. 3A to 3C.

In the structure shown in FIGS. 3A to 3C, two thin film transistors and one thin film transistor are formed on a substrate 101 and a silicon oxide film 112 which are formed of different layers, respectively, and a gate insulating film 116 and gate electrodes 117, 118 and 119 of the respective thin film transistors are formed in the same layer.

In the specification, the expression "the same layer" means that the layer is made of the same material. For example, the gate electrodes 117, 118 and 119 are obtained by patterning an aluminum film (this is a material that constitutes the same layer) formed on the overall surface.

According to still another aspect of the present invention, there is provided a semiconductor device which comprises at least two thin film transistors; wherein an active layer of said thin film transistors is formed in a different layer, respectively; and wherein a gate insulating film and a gate electrode of each of said thin film transistors are formed in the same layer.

Figure 1A:
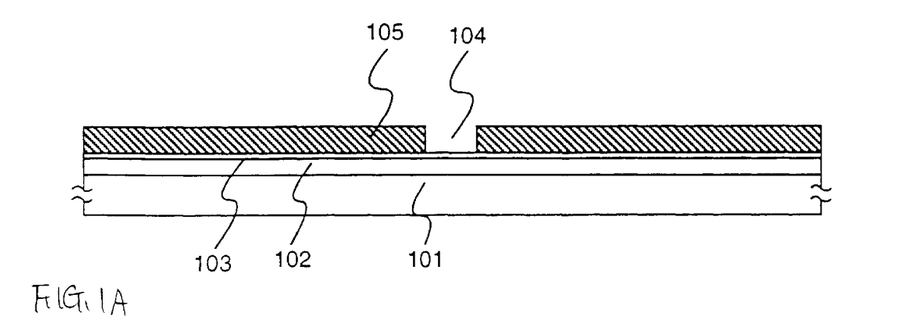
FIGS. 1A to 1E are diagrams showing a process of manufacturing a thin film transistor of the first embodiment.
Figure 1B:
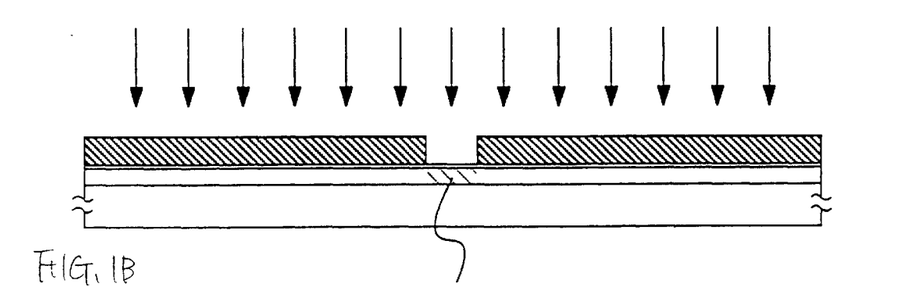
Figure 1C:
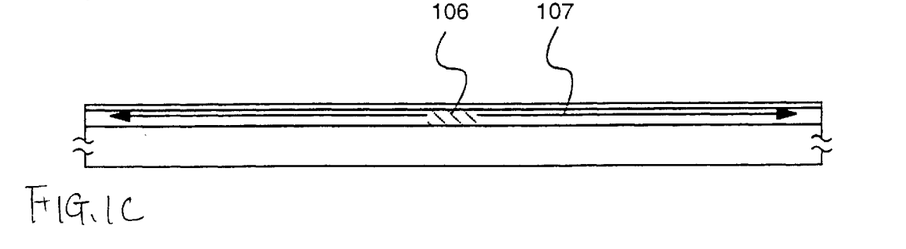
Figure 1D:
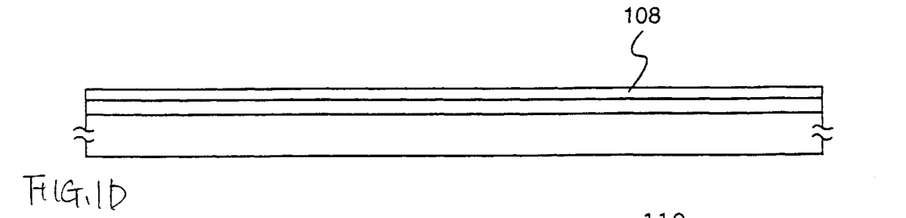
Figure 1E:
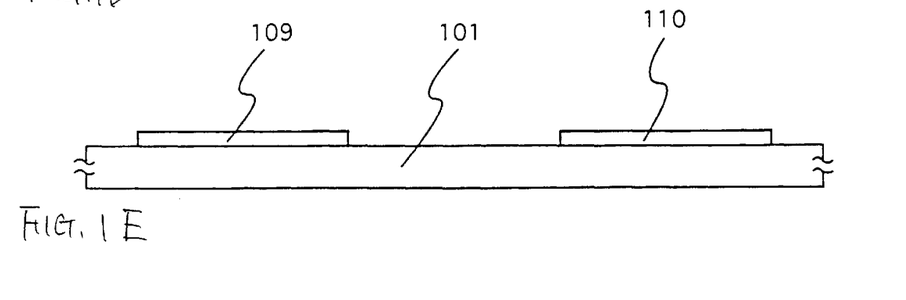
Figure 2A:
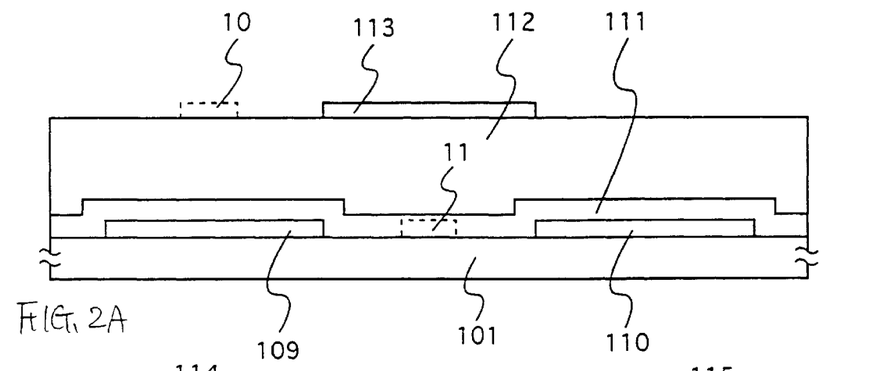
FIGS. 2A to 2D are diagrams showing a process of manufacturing a thin film transistor of the first embodiment.
Figure 2B:
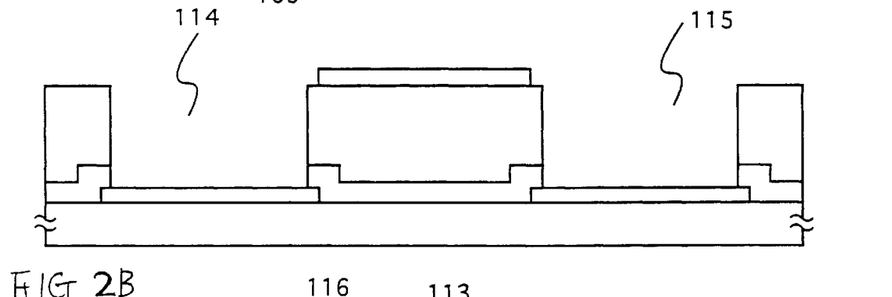
Figure 2C:
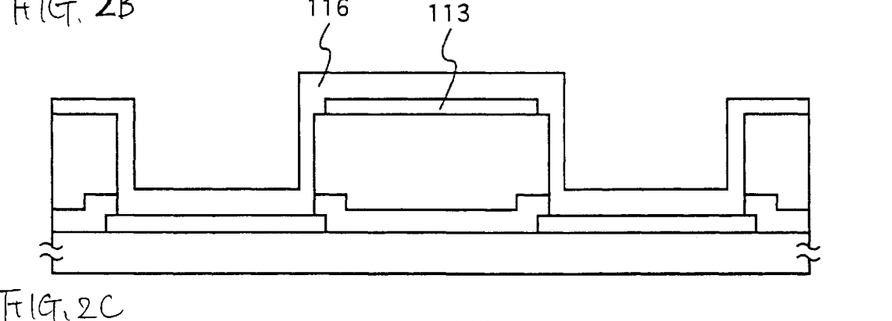
Figure 2D:
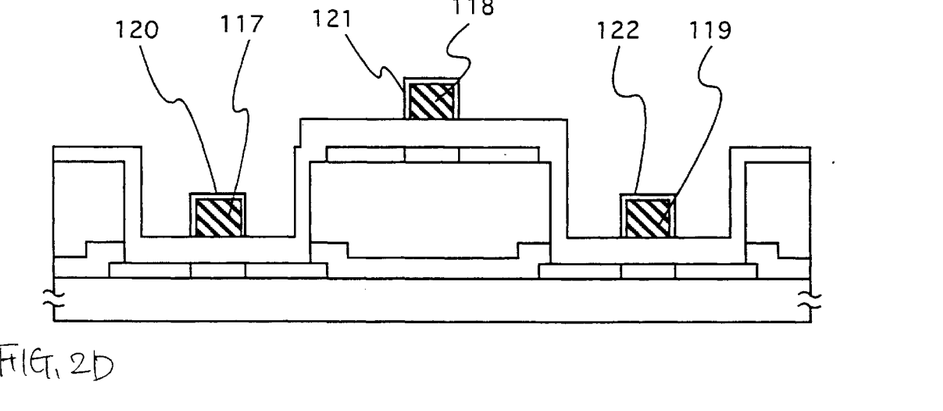

According to yet still another aspect of the present invention, there is provided a method of manufacturing a semiconductor device, which comprising the steps of:

forming an active layer of a first thin film transistor with a first silicon film;

forming an insulating film on said active layer (for example, a process of FIG. 1E);

forming an active layer of a second thin film transistor on said insulating film with a second silicon film (for example, a process of FIG. 2A);

forming gate insulating films of said first and second thin film transistors with a common insulating film (for example, a process of FIG. 2C); and forming the gate insulating films of said first and second thin film transistors with a common material (for example, a process of FIG. 2D).

As shown in FIG. 2A, a second active layer 113 is formed above a region 11 into which nickel elements have been introduced, and a first active layer 119 is formed below a region 10 into which nickel elements have been introduced.

The region of the silicon film into which the nickel elements have been introduced cannot be used for the active layer of the thin film transistor because it contains a large amount of nickel silicide components.

Therefore, the region of the silicon film into which the nickel elements have been introduced finally results in a dead space.

In the case where crystal is allowed to grow in an orientation in parallel to a substrate using the above-mentioned nickel elements, that problem is unavoidably caused to be active. In other words, there arises such a problem that it is difficult to increase integration to a certain degree or more.

With the application of the structure described in this invention, the integration degree of the device can be enhanced while applying a specific crystal growing method using nickel elements.

Also, as indicated by reference numeral 116 in FIG. 2, the gate insulating film of a TFT formed in an upper layer is made common to the gate insulating film of a TFT formed in a lower layer to constitute a multiple layer so that a manufacturing process can be prevented from being complicated, applying a structure in which its concentration degree is enhanced.

Also, since a TFT where a starting film that constitutes the gate electrodes 117 to 119 is formed in an upper layer is made common to a TFT where it is formed in a lower layer, a manufacturing process can be prevented from being complicated.

DETAILED DESCRIPTION OF THE PREFERRED EMBODIMENTS

First Embodiment

FIGS. 1A to 3C show a process of manufacturing a semiconductor device in accordance with a first embodiment. First, an amorphous silicon film 102 is formed in thickness of 500 Å on a quartz substrate 101 through the low pressure CVD method.

Then, an oxide film is formed on a surface of amorphous silicon film 102 by applying UV light from a UV lamp. The thickness of the oxide film is set to about several tens Å (in general, the thickness which is difficult to measure).

Thereafter, a resist mask 105 is formed. The resist mask 105 is formed with a slender slit-like opening 104 that extends from a front side toward a back side of the drawing (FIG. 1A).

After obtaining a state shown in FIG. 1A, doping of Ni elements is conducted through the ion implanting method as shown in FIG. 1B. In this situation, Ni ions are blocked in a region where the resist mask exists, and the amorphous silicon film 102 is doped with Ni ions only in a region of the opening 104.

In FIG. 1B, there is shown a state where nickel elements have been introduced in a region 106. It should be noted that a UV oxide film 103 does not obstruct the implantation of Ni ions because it is thin in thickness.

Other than Ni, elements selected from Fe, Co, Ru, Rh, Pd, Os, Ir, Pt, Cu and Au can be employed.

Subsequently, the resist mask is removed. Then, a heat treatment is conducted at 600° C. for 8 hours in a nitrogen atmosphere. In this heat treatment process, the amorphous silicon film is crystallized. In this situation, as shown in FIG. 1C, crystal growth is progressed from the region 106 where nickel has been introduced toward an orientation in parallel to the substrate as indicated by reference numeral 107.

A crystal state obtained by this crystal growth becomes bar-shaped or flat bar-shaped crystal having a width of several tens to several hundreds nm. The bar-shaped or flat bar-shaped crystal is unique with a structure in which it extends over a length of several tens μm or more.

After the completion of crystallization shown in FIG. 1C, a heat treatment is conducted in an oxidation atmosphere containing halogen elements to form a thermal oxide film. In particular, a heat treatment is conducted at 950° C. for 20 minutes in an oxygen atmosphere containing HCl of 3 volume %, to thereby form a thermal oxide film 108 having a thickness of 200 Å.

The formation of the thermal oxide film has the actions and effects as stated below.

(1) Nickel elements are taken in the thermal oxide film to reduce the concentration of nickel elements remaining in the silicon film.

(2) Defects are reduced in the film with the consumption of silicon elements in formation of the thermal oxide film (in other words, crystallinity is improved.) Gas containing halogen elements other than HCl can be employed.

After the formation of the thermal oxide film 108, the thermal oxide film 108 is removed. Nickel elements are contained in the thermal oxide film 108 at a relatively high concentration. Therefore, with the removal of the thermal oxide film 108, the concentration of nickel remaining in the device when constituting the device can be finally reduced.

Then, the crystalline silicon film as obtained (the silicon film after being subjected to crystallization is called "crystalline silicon film") is patterned to form islands indicated by reference numeral 109 and 110. Those islands become active layers of the thin film transistors (FIG. 1E).

In this way, there can be obtained a state in which the active layers 109 and 110 of the thin film transistors are formed on the quartz substrate 101.

Subsequently, a silicon nitride film 111 is formed in thickness of 1500 Å through the plasma CVD method.

Moreover, a silicon oxide film is formed in thickness of 2 μm, and its surface is polished and flattened. A chemical method is used as the polishing method. Alternatively, a method such as CMP may be used as the polishing method.

In this way, a silicon oxide film 112 which is flattened as indicated by reference numeral 112 in FIG. 2A is obtained.

Next, an active layer 113 which is formed of a crystalline silicon film is obtained through processes shown in FIGS. 1A to 1E. In this way, active layers 109, 110 and 113 which are formed in a multiple layer are obtained as shown in FIG. 2A.

What are indicated by reference numeral 10 and 11 in FIG. 2A are regions of the amorphous silicon film into which nickel elements have been introduced (those regions do not exist in the state shown in FIG. 2A).

Since the regions into which nickel elements have been introduced are removed at a high etching rate, an under layer is slightly over-etched. Therefore, with the observation of the surface state of the under layer (for example, a state of the substrate surface), the regions into which nickel has been introduced in a final complete state can be specified.

After obtaining the state shown in FIG. 2A, openings 114 and 115 are formed (FIG. 2B).

Then, after obtaining the state shown in FIG. 2B, a gate insulating film 116 is formed in thickness of 600 Å as shown in FIG. 2C. A method of forming the gate insulating film 116 is as follows:

(1) A silicon oxide film is first formed in thickness of 300 Å through the plasma CVD method.

(2) Thereafter, a thermal oxide film is formed in thickness of 300 Å through the thermal oxidizing method.

Through the above method, there is obtained a gate insulating film which is formed of a lamination film consisting of the thermal oxide film and the silicon oxide film which is formed through the plasma CVD method (a integrated silicon oxide film to all appearances).

Since the thermal oxide film is formed inside of the silicon oxide film, the gate insulating film 116 is structured such that the thermal oxide film and the CVD silicon oxide film are laminated from the active layer side.

After obtaining the state shown in FIG. 2C, patterns 117, 118 and 119 of the gate electrodes which are made of aluminum are formed (FIG. 2D).

The pattern surfaces of the respective gate electrodes are formed with anodic oxide films (aluminum oxide films) 120, 121 and 122 through the anodic oxidizing method. The anodic oxide film has an effect of enhancing the heat resistance of aluminum which is low in heat resistance. In particular, it has the effect of suppressing the generation of a projection such as hillock or whisker which are caused when heating.

A material of which the gate electrode is made may be a silicide material or a silicon material which is heavy doped.

After obtaining the state shown in FIG. 2D, doping with impurities that give one conductivity is conducted in order to form the source and drain regions.

If a p-channel type and an n-channel type are shared, selective doping may be conducted using a mask.

A means of conducting doping may be a plasma doping method or an ion doping method.

After doping, a laser beam is applied to anneal damages caused when doping with the impurities and to activate the impurities.

In this way, a state shown in FIG. 3A is obtained. In FIG. 3A, reference numeral 31 denotes a source region; 32 is channel region; and 33 is a drain region. Also, reference numeral 34 denotes a source region; 35 is a channel region;

and 36 is a drain region. Also, reference numeral 37 denotes a source region, 38 is a channel region, and 39 is a drain region.

Thereafter, a silicon oxide film is formed through the plasma CVD method, and its surface is flattened to obtain an insulating film 123 (FIG. 3B).

The insulating film 123 may be replaced by a silicon nitride film, a laminated film consisting of a silicon nitride film and a silicon oxide film, or a laminated film consisting of those films and a resin film. A material of which the resin film is made may be polyimide, polyimide-amide, polyamide, acrylic or epoxy.

After obtaining a state shown in FIG. 3B, contact holes are define to form source and drain electrodes (and wiring extending from there).

In this example, source electrodes 124, 126 and 128 are formed. Also, drain electrodes 125, 127 and 129 are formed.

In this way, a structure in which the thin film transistors are integrated in a multiple layer can be obtained. The features of this structure resides in that the gate insulating film and the gate electrode are formed in the same layer in the respective thin film transistors although the layers where the active layer of the thin film transistor in the respective layers exist are different. Also, the process of doping with the impurities is conducted in the same process regardless of a layer in which the active layer is formed.

With the above structure, a manufacturing process can be simplified although the structure is complicated.

Second Embodiment

A second embodiment is directed to a method employing a solvent as a method of introducing Ni elements described in the first embodiment.

In this embodiment, a mask (corresponding to reference numeral 105) is formed with a silicon oxide film which is formed through the plasma CVD method instead of the resist mask 105 shown in FIG. 1.

Then, in the state shown in FIG. 1A, nickel acetate salt solution the concentration of nickel elements of which is adjusted to a predetermined concentration is coated through the spin coating method, to thereby obtain a state in which nickel elements are held in contact with the entire surface.

In this case, there is obtained a state in which the nickel elements are held in contact with the amorphous silicon film 102 through the UV oxide film 103 in the region of the opening 104.

Then, a heat treatment is performed for crystallization to crystallize the amorphous silicon film. In this situation, the nickel elements are diffused in the silicon film through the very thin UV oxide film 103, to thereby promote crystallization.

Third Embodiment

A third embodiment is directed to an example of an electronic device using an integrated circuit which is formed of thin film transistors. FIGS. 4A to 4F show outlines of the respective devices.

Figure 4A:
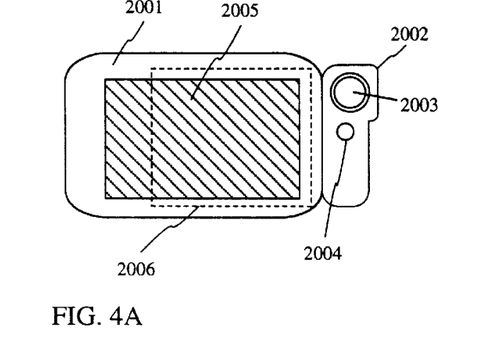
FIGS. 4A to 4F are diagrams showing various examples of apparatuses using an integrated circuit which is formed of thin film transistors of the third embodiment.

What is shown in FIG. 4A is a portable information processing terminal which has a communication function using a telephone line.

In the electronic device, an integrated circuit 2006 which is formed of a composite circuit as described in the present specification is equipped within a main body 2001. Then, there are provided an active matrix liquid-crystal display 2005, a camera section 2002 taking an image in, and an operating switch 2004.

Figure 4B:
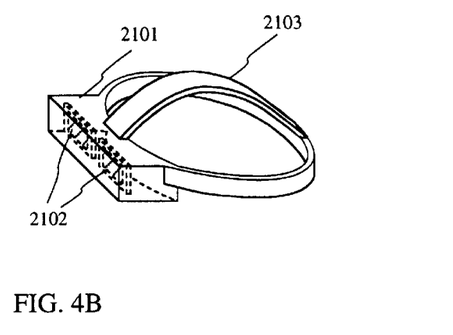

What is shown in FIG. 4B is an electronic device which is called "head mount display". This device is put on a head and has a function of virtually displaying an image in front of eyes. The electronic device is designed such that a main body 2101 is put on the head by a band 2103. The image is produced by the liquid-crystal display device 2102 which is provided in correspondence with right and left eyes.

Since the electronic device of this type must be lightened in weight, it is suitable to employ a circuit which is three-dimensionally integrated as described in the present specification.

Figure 4C:
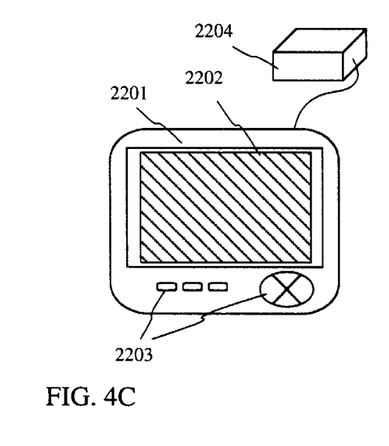

What is shown in FIG. 4C has a function of displaying map information or a variety of information on the basis of a signal from an artificial satellite. Information from the artificial satellite which is received by an antenna 2204 is processed through an electronic circuit provided within the main body 2201 so that information necessary for the liquid-crystal display device 2202 is displayed.

The manipulation of the device is conducted by an operating switch 2203. Even in this device, a devise is required to downsize the entire structure. To satisfy this, it is useful to the use of the composite circuit described in the present specification.

Figure 4D:
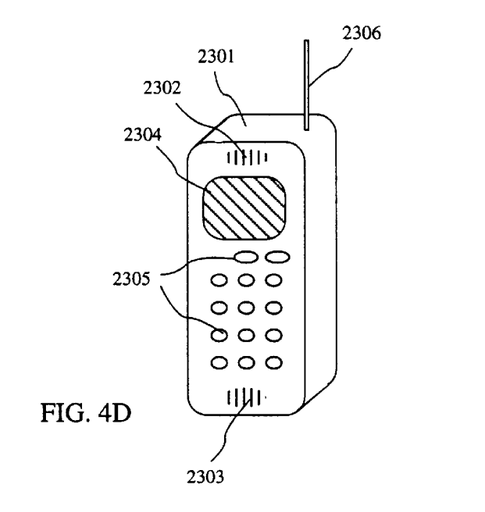

What is shown in FIG. 4D is a portable telephone. In this electronic device, a main body 2301 is provided with an antenna 2306, a voice output section 2302, a liquid crystal display device 2304, an operating switch 2305 and a voice input section 2303.

Even in this electronic device, in order to downsize the entire structure, it is useful to use the composite circuit described in the present specification.

Figure 4E:
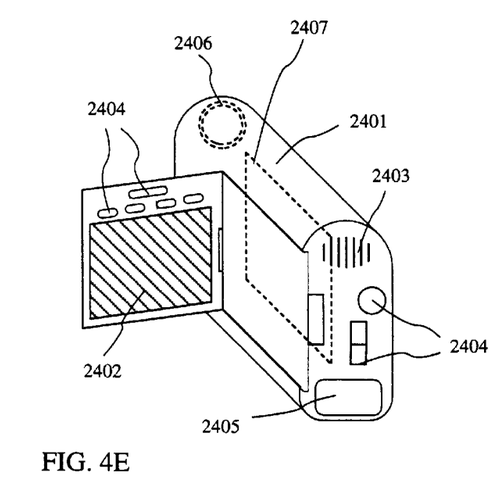

An electronic device shown in FIG. 4E is a portable image pickup device which is called "video camera". The electronic device is equipped with a liquid-crystal display 2402 attached to an open/close member of a main body 2401 and an operating switch 2404 attached to the open/close member.

Furthermore, the main body 2401 is equipped with an image receiving section 2406, an integrated circuit 2407, a voice input section 2403, an operating switch 2404 and a battery 2405.

Even in this electronic device, in order to downsize the entire structure, it is useful to use the composite circuit described in the present specification.

Figure 4F:
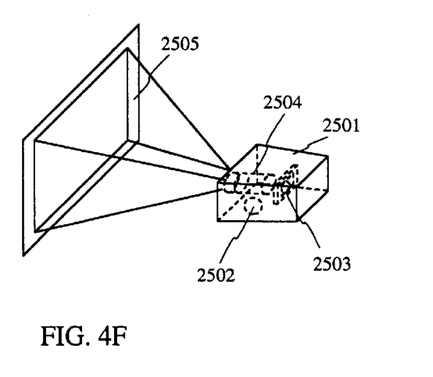

An electronic device shown in FIG. 4F is a projection type liquid crystal display device. This device includes a light source 2502, a liquid crystal display device 2503 and an optical system 2504 in a main body 2501, and has a function of projecting an image on the screen 2505.

The projection type display device is also demanded to be downsized and lightened in weight. Therefore, in order to satisfy this demand, it is useful to apply the present invention described in this specification.

Also, the liquid-crystal display device in the above-mentioned electronic device may be any one of a transmission type and a reflection type. The transmission type is advantageous from the viewpoint of display characteristics, whereas the reflection type is advantageous in the case where a low power consumption or a downsized and lightened device is pursued.

Also, the display device may be a flat panel display such as an active matrix type EL display or a plasma display.

Fourth Embodiment

A fourth embodiment is directed to an example in which a polycrystal silicon wafer is used as a substrate in the structure shown in the first embodiment.

The polycrystal silicon wafer is available at the costs first several or lower as less as the quartz substrate. Therefore, it can largely contribute to a reduction of the costs of the circuit and the device.

In this embodiment, a silicon oxide film is first formed in thickness of 1 μm on a polysilicon wafer through the plasma CVD method. Then, a thermal oxide film is formed in thickness of 50 nm (500 Å) through thermal oxidation.

Through the above process, a silicon oxide film a surface of which is flattened and which is excellent in surface characteristics can be formed on the polycrystal wafer.

Then, a TFT is made on the silicon oxide film as an under film (base body).

It should be noted that it is not preferable that the thermal oxide film is formed directly on the polycrystal silicon wafer, and the thermal oxide film is used as the under film. This is because in case of only the thermal oxide film, the surface of the thermal oxide film becomes rough because the polycrystal structure of the substrate is reflected, which adversely affects the manufacture of the TFT and its characteristics.

Also, although the polycrystal silicon wafer can be replaced by a monocrystal silicon wafer, an advantage of the low costs is reduced.

Fifth Embodiment

Figure 5:
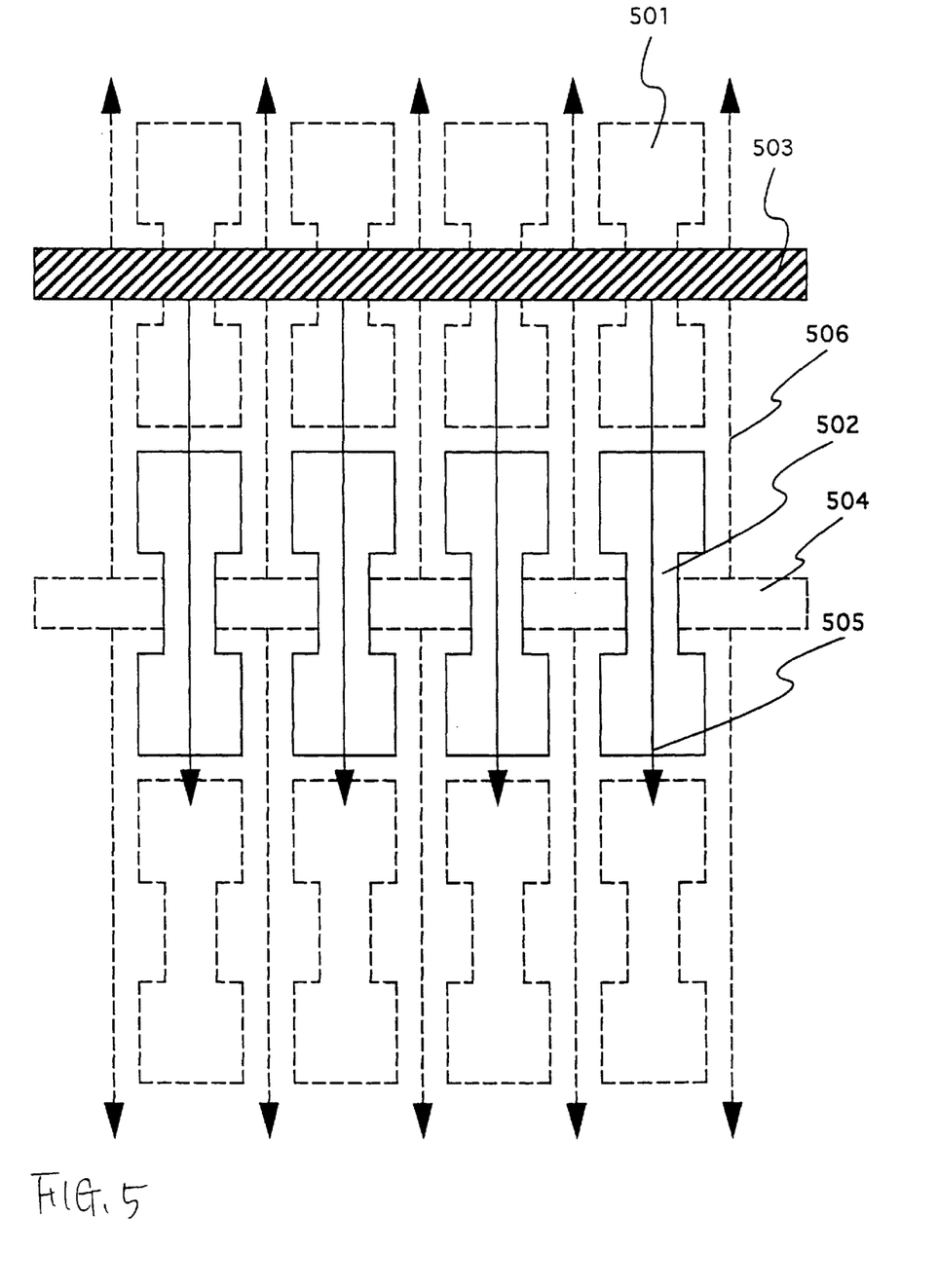
FIG. 5 is a diagram showing a structure in which a large number of thin film transistors are integrated of the fifth embodiment.

A fifth embodiment is directed to an example in which a large number of TFTs are integrated using a basic structure shown in the first embodiment. FIG. 5 shows an outline of the structure of this embodiment viewed from an upside.

In the FIG. 5, a pattern indicated by a dotted line exists in a lower layer, and what is indicated by a solid line exists in an upper layer.

In other words, what is indicated by reference numeral 501 is a lower active layer. Also, what is indicated by reference numeral 504 is a nickel introduced region used for the formation of the lower active layer. An arrow indicated by reference numeral 506 exhibits crystal growth in parallel to the substrate.

On the other hand, what is indicated by reference numeral 502 is an upper active layer. Also, what is indicated by reference numeral 503 is a nickel introduced region used for the formation of the upper active layer. An arrow indicated by reference numeral 505 exhibits crystal growth in parallel to the substrate.

As is apparent from FIG. 5, an upper active layer group which is represented by reference numeral 502 is formed on the lower nickel introduced region 504, and a lower active layer group which is represented by reference numeral 501 is formed on the upper nickel introduced region 503.

Through the above process, the integration degree of the device can be enhanced.

Also, the structure shown in FIG. 5 is of the structure in which the lower active layer is not overlapped with the upper active layer.

This structure has the following advantages.

(1) An electronic interference between the active layers is suppressed.

(2) The generation of a stress between the active layers is suppressed.

(3) A contact and the formation of wiring are facilitated.

Sixth Embodiment

Figure 6:
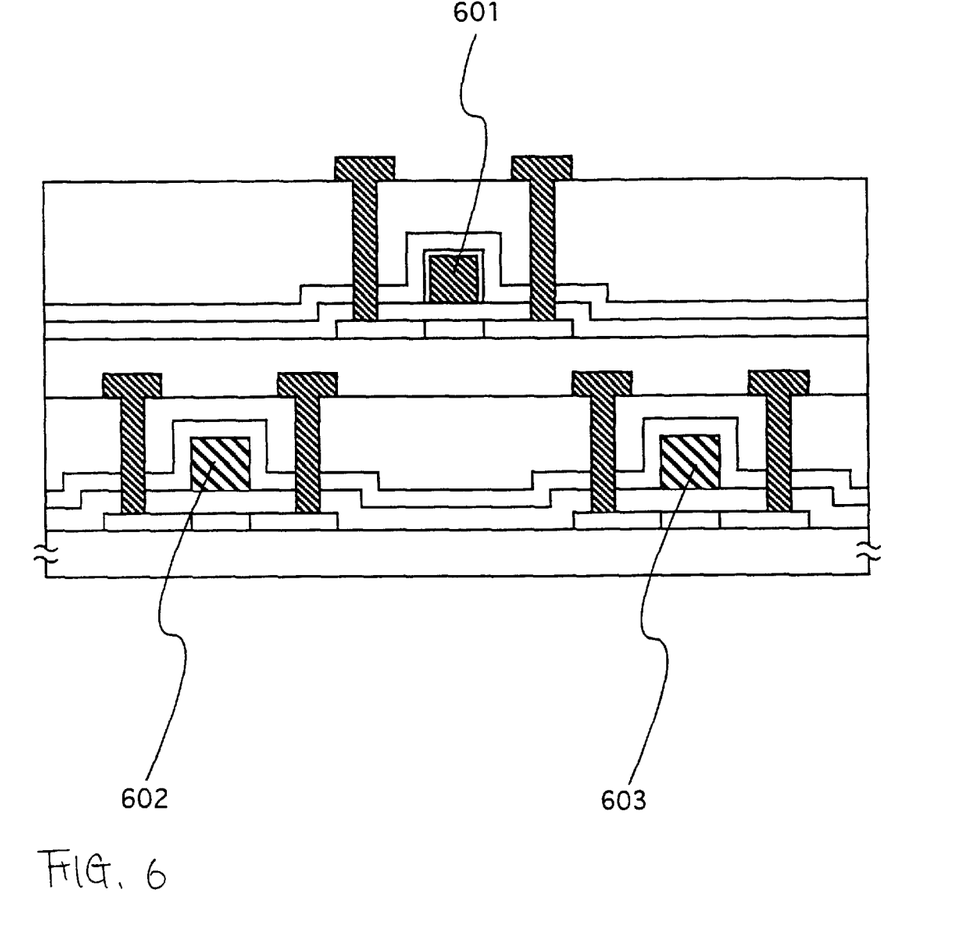
FIG. 6 is a diagram showing thin film transistors which are formed in multiple layers of the sixth embodiment.

A sixth embodiment is directed to an example in which the gate insulating film and the gate electrode in the respective layer are separated as shown in FIG. 6.

In case of this structure, an upper-layer TFT active layer is formed after the formation of a lower-layer TFT active layer.

Therefore, a material of the lower-layer TFT gate electrode is required to withstand a heat treatment which is carried out during a process of forming an active layer.

In this example, the material of the gate electrodes indicated by reference numeral 602 and 603 is made of a silicon material which is doped with high-density impurities that give a conductive type. Then, a gate electrode indicated by reference numeral 601 is made of aluminum.

Seventh Embodiment

A seventh embodiment is directed to an example in which a crystal growth distance is different between upper and lower layers in the structure shown in the first embodiment.

A method of differing the crystal growth distance is as follows:

(1) To change a width of a nickel added region.

(2) To change a dose amount of nickel ions.

(3) To combine the above two methods.

When the growth distance is differed, there can be manufactured a TFT different in characteristic depending on a difference of the growth distance.

Eighth Embodiment

As the structure of a TFT when implementing the present invention described in the first to seventh embodiments of this specification, a bottom gate type can be used. Also, as a material of the gate electrode, silicon or a material that mainly contains silicon (for example, a variety of silicide is used) can be employed.

Utilizing the present invention described in this specification, a novel structure in which thin film transistors are three-dimensionally integrated with a high density can be obtained.

What is claimed is:

1. A semiconductor device comprising:

at least two thin film transistors formed on different layers; and each of said two thin film transistors having an active layer comprising a crystal semiconductor film, wherein said crystal semiconductor film is subjected to crystal growth in parallel to said layers from a metal introduced region, said metal being capable of promoting crystallization of semiconductor; and wherein said metal introduced region is formed above or below at least one of said active layers.

2. A device according to claim 1 wherein each of said thin film transistors includes a gate insulating film and a gate electrode which are formed in the same layer.

3. A semiconductor device including at least a first thin film transistor and a second thin film transistor, said semiconductor device comprising:

a first crystalline semiconductor island for the first thin film transistor formed on an insulating surface, said first crystalline semiconductor island including first source and drain regions and a first channel region formed therebetween;

a common gate insulating film on the first crystalline semiconductor island;

a first gate electrode formed on the common gate insulating film;

a second crystalline semiconductor island for the second thin film transistor formed over the insulating surface, said second crystalline semiconductor island including second source and drain regions and a second channel region therebetween and being located on a higher level than the first crystalline semiconductor island; and a second gate electrode formed on the common gate insulating film;

wherein the common gate insulating film covers both the first and the second crystalline semiconductor islands.

4. A semiconductor device including at least a first thin film transistor and a second thin film transistor, said semiconductor device comprising:

a first crystalline semiconductor island for the first thin film transistor formed on an insulating surface, said first crystalline semiconductor island including first source and drain regions and a first channel region formed therebetween;

a common gate insulating film on the first crystalline semiconductor island;

a first gate electrode formed on the common gate insulating film;

a second crystalline semiconductor island for the second thin film transistor formed over the insulating surface, said second crystalline semiconductor island including second source and drain regions and a second channel region therebetween and being located on a higher level than the first crystalline semiconductor island;

a second gate electrode formed on the common gate insulating film; and a resin film formed over the first gate electrode, the second gate electrode and the common gate insulating film;

wherein the common gate insulating film covers both the first and the second crystalline semiconductor islands.

5. A device according to claim 1 wherein said crystalline semiconductor film is a crystalline silicon film.

6. A device according to claim 4, wherein each of said first and second crystalline semiconductor islands is a crystalline silicon island.

7. A semiconductor device including at least a first thin film transistor and a second thin film transistor, said semiconductor device comprising:

a first crystalline semiconductor island for the first thin film transistor formed on an insulating surface, said first crystalline semiconductor island including first source and drain regions and a first channel region formed therebetween;

a common gate insulating film on the first crystalline semiconductor island;

a first gate electrode formed on the common gate insulating film;

a second crystalline semiconductor island for the second thin film transistor formed over the insulating surface, said second crystalline semiconductor island including second source and drain regions and a second channel region therebetween and being located on a higher level than the first crystalline semiconductor island;

a second gate electrode formed on the common gate insulating film;

a silicon nitride film covering the first gate electrode, the second gate electrode and the common gate insulating film;

a resin film formed on the silicon nitride film; and at least an electrode formed on the resin film and being electrically connected to at least one of the first and second thin film transistors, wherein the common gate insulating film covers both the first and the second crystalline semiconductor islands.

8. A device according to claim 7, wherein said semiconductor device is one selected from the group consisting of a portable information processing terminal, a head mount display, a portable telephone, a video camera and a projector.

9. A device according to claim 1, wherein said semiconductor device is an EL display device.

10. A device according to claim 3, wherein said semiconductor device is an EL display device.

11. A device according to claim 4, wherein said semiconductor device is an EL display device.

12. A device according to claim 7, wherein said semiconductor device is an EL display device.

13. A device according to claim 1, wherein said semiconductor device is one selected from the group consisting of a portable information processing terminal, a head mount display, a portable telephone, a video camera and a projector.

14. A device according to claim 3, wherein said semiconductor device is one selected from the group consisting of a portable information processing terminal, a head mount display, a portable telephone, a video camera and a projector.

15. A device according to claim 4, wherein said semiconductor device is one selected from the group consisting of a portable information processing terminal, a head mount display, a portable telephone, a video camera and a projector.

16. A device according to claim 3, wherein each of said first and second crystalline semiconductor islands is a crystalline silicon island.

17. A device according to claim 7, wherein each of said first and second crystalline semiconductor islands is a crystalline silicon island.

18. A device according to claim 4, wherein the resin film comprises at least one selected from the group consisting of polyimide, polyimide-amide, polyamide, acrylic and epoxy.

19. A device according to claim 7, wherein the resin film comprises at least one selected from the group consisting of polyimide, polyimide-amide, polyamide, acrylic and epoxy.

* * * * *